(12) United States Patent
Basker et al.

(10) Patent No.: US 8,912,056 B2
(45) Date of Patent: Dec. 16, 2014

(54) DUAL EPITAXIAL INTEGRATION FOR FINFETS

(71) Applicant: International Business Machines Corporation, Armonk, NY (US)

(72) Inventors: Veeraraghavan S. Basker, Schenectady, NY (US); Effendi Leobandung, Wappingers Falls, NY (US); Xinhui Wang, Poughkeepsie, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 13/860,791

(22) Filed: Apr. 11, 2013

(65) Prior Publication Data

US 2014/0308781 A1    Oct. 16, 2014

(51) Int. Cl.
*H01L 21/84* (2006.01)
*H01L 21/331* (2006.01)
*H01L 21/337* (2006.01)

(52) U.S. Cl.
CPC .................................. *H01L 21/845* (2013.01)
USPC ............ 438/154; 438/229; 438/300; 438/151

(58) Field of Classification Search
CPC ....................................................... H01L 21/84
USPC .................................. 438/154, 238, 284, 365
See application file for complete search history.

(56) References Cited

U.S. PATENT DOCUMENTS

| | | | |
|---|---|---|---|
| 7,381,649 B2 | 6/2008 | Chen et al. | |
| 7,736,954 B2 | 6/2010 | Hussain et al. | |
| 7,759,201 B2 | 7/2010 | Petti et al. | |
| 7,842,566 B2 | 11/2010 | Lee et al. | |
| 2006/0177977 A1 | 8/2006 | Chan et al. | |
| 2010/0219474 A1* | 9/2010 | Kronholz et al. | 257/347 |
| 2011/0057267 A1 | 3/2011 | Chuang et al. | |
| 2011/0068407 A1* | 3/2011 | Yeh et al. | 257/369 |
| 2011/0108920 A1* | 5/2011 | Basker et al. | 257/351 |
| 2011/0193179 A1 | 8/2011 | Fung et al. | |
| 2011/0201164 A1 | 8/2011 | Chung et al. | |

OTHER PUBLICATIONS

L. Witters et al., "Multiple-Vt FinFET devices through La2O3 dielectric capping," IEEE International SOI Conference, Oct. 6-9, 2008, pp. 121-122.

A. Veloso et al., "Full-field EUV and immersion lithography integration in 0.186μm2 FinFET 6T-SRAM cell," IEEE International Electron Devices Meeting, IEDM 2008, Dec. 15-17, 2008, 4 pages.

* cited by examiner

*Primary Examiner* — Asok K Sarkar
*Assistant Examiner* — Dmitriy Yemelyanov
(74) *Attorney, Agent, or Firm* — Law Offices of Ira D. Blecker, P.C.

(57) ABSTRACT

A dual epitaxial integration process for FinFET devices. First and second pluralities of fins and gates are formed, with some of the fins and gates being for NFETs and some of the fins and gates being for PFETs. A first layer of a hard mask material selected from the group consisting of titanium nitride, tungsten nitride, tantalum nitride, amorphous carbon and titanium carbide is deposited over the NFETs and PFETs. The hard mask material is removed from one of the NFETs and PFETs and a first source and drain material is epitaxially deposited on the fins. A second layer of the hard mask material is deposited over the NFETs and PFETs. The first and second layers of the hard mask material are removed from the other of the NFETs and PFETs and a second source and drain material is deposited on the fins.

14 Claims, 18 Drawing Sheets

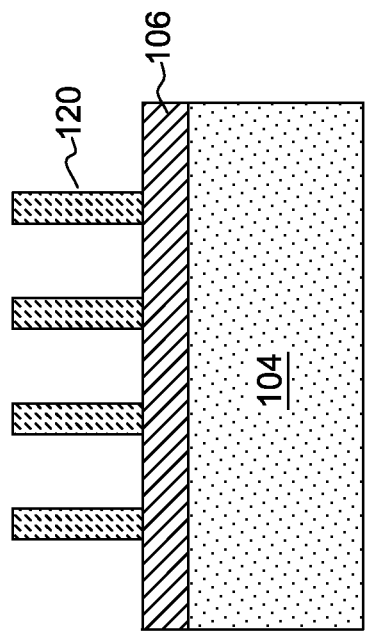
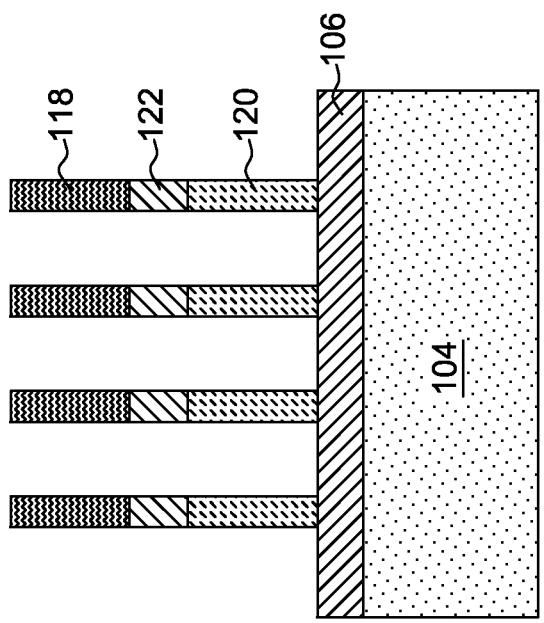

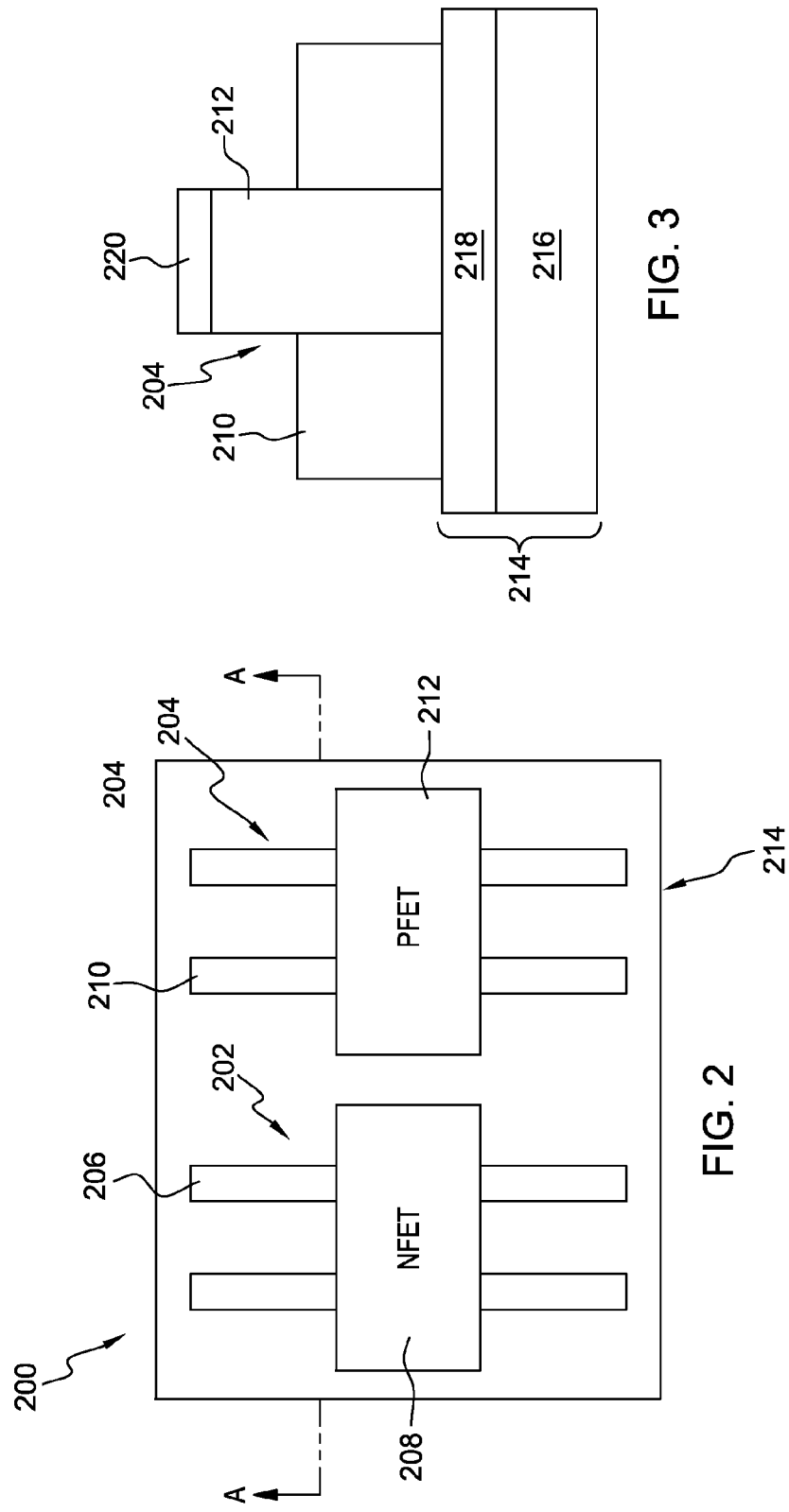

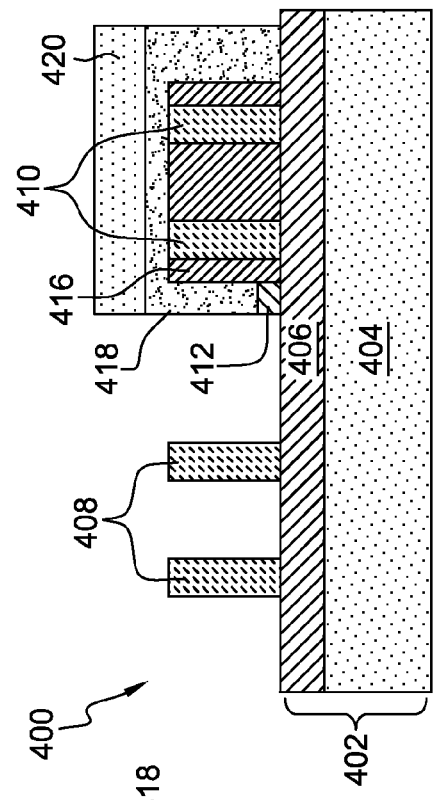
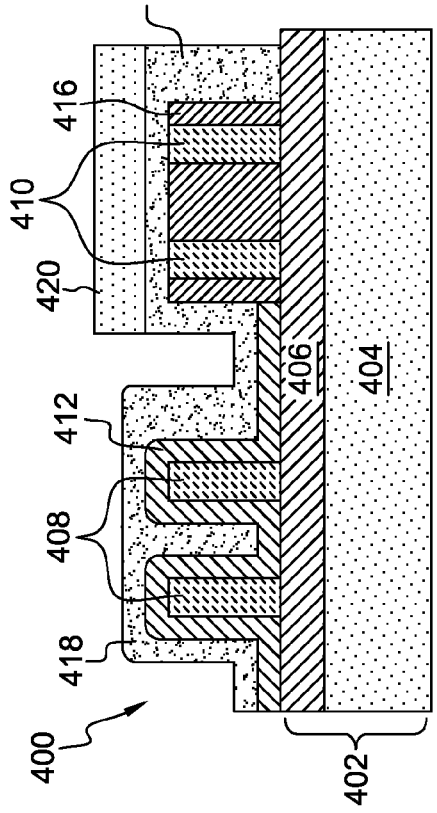
FIG. 11
FIG. 10

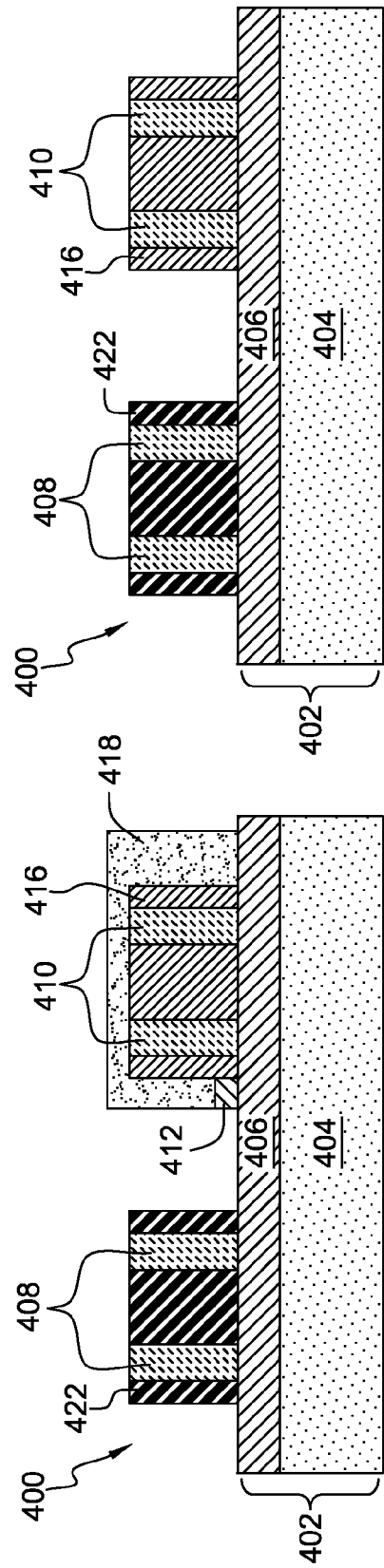

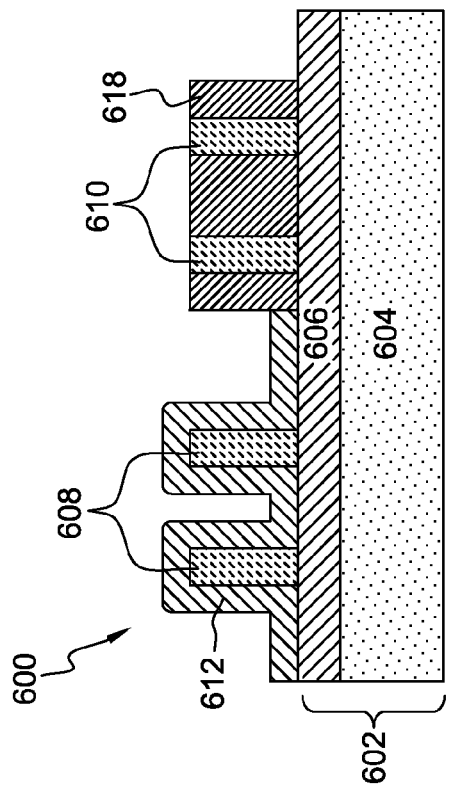
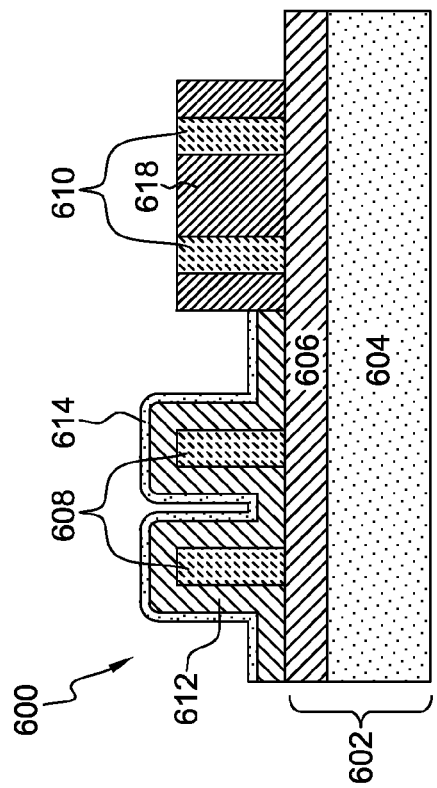

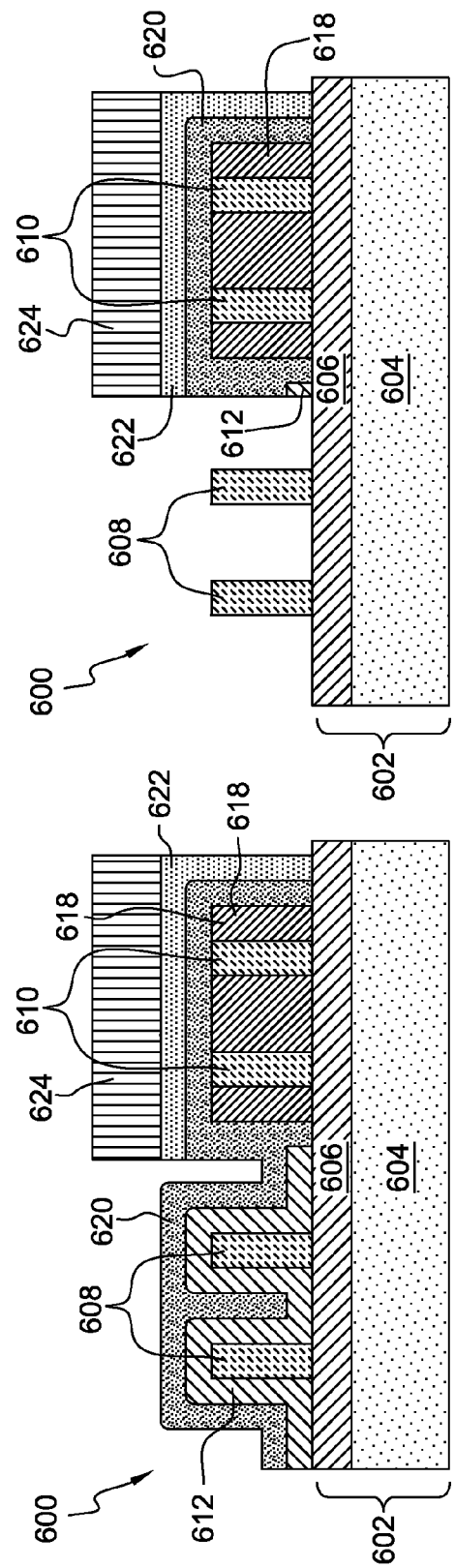

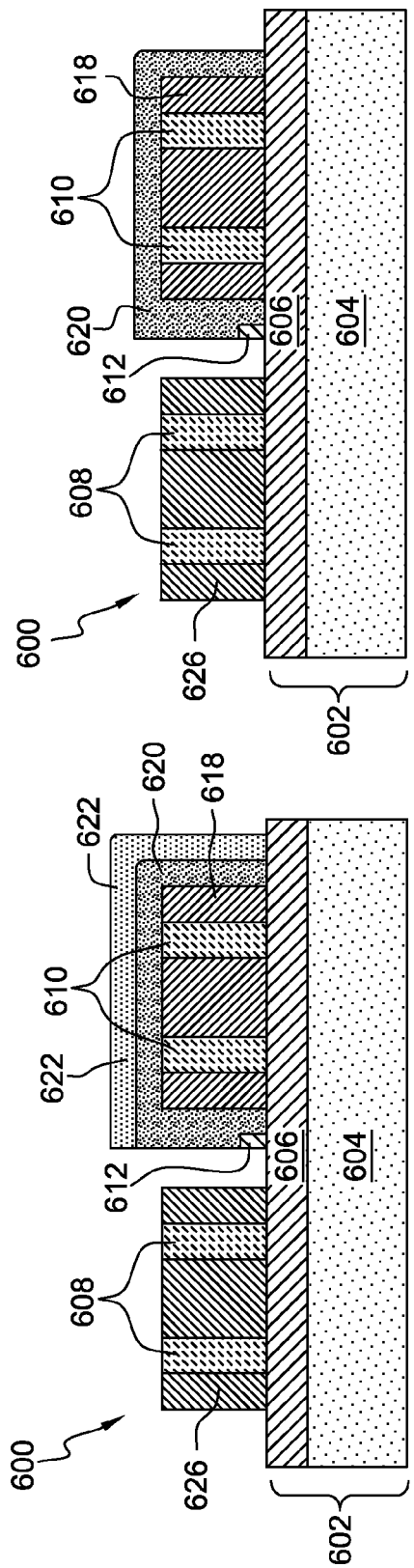

US 8,912,056 B2

DUAL EPITAXIAL INTEGRATION FOR FINFETS

BACKGROUND

The present invention relates to FinFET structures and, more particularly, relates to the formation of dual epitaxial sources and drains for NFET and PFET devices in a CMOS process flow.

FinFET devices and FinFET structures are nonplanar devices and structures typically built on a semiconductor on insulator (SOI) substrate. The FinFET devices are field effect transistors which may comprise a vertical semiconductor fin, rather than a planar semiconductor surface, having a single or double gate wrapped around the fin. In an effort to provide for continued scaling of semiconductor structures to continuously smaller dimensions while maintaining or enhancing semiconductor device performance, the design and fabrication of semiconductor fin devices and semiconductor fin structures has evolved within the semiconductor fabrication art.

BRIEF SUMMARY

The various advantages and purposes of the exemplary embodiments as described above and hereafter are achieved by providing, according to a first aspect of the exemplary embodiments, a dual epitaxial integration process for FinFET devices including: forming a first plurality of fins on a semiconductor substrate; forming a first plurality of gates with each gate of the first plurality of gates wrapping around at least one of the fins of the first plurality of fins, the first plurality of fins and first plurality of gates being for N-type FinFET devices (NFETs); forming a second plurality of fins on the semiconductor substrate; forming a second plurality of gates with each gate of the second plurality of gates wrapping around at least one of the fins of the second plurality of fins, the second plurality of fins and second plurality of gates being for P-type FinFET devices (PFETs); depositing a first layer of a hard mask material selected from the group consisting of titanium nitride, tungsten nitride, tantalum nitride, amorphous carbon and titanium carbide over the NFETs and PFETs; removing the hard mask material from one of the NFETs and PFETs and avoiding removing the hard mask material from the other of the NFETs and PFETs; epitaxially depositing a first source and drain material on the fins of the one of the NFETs and PFETs; depositing a second layer of the hard mask material over the NFETs and PFETs; removing the first and second layers of the hard mask material from the other of the NFETs and PFETs; epitaxially depositing a second source and drain material on the fins of the other of the NFETs and PFETs; and removing the second layer of the hard mask material from the one of the NFETs and PFETs.

According to a second aspect of the exemplary embodiments, there is provided a dual epitaxial integration process for FinFET devices including: forming a first plurality of fins on a semiconductor substrate; forming a first plurality of gates with each gate of the first plurality of gates wrapping around at least one of the fins of the first plurality of fins, the first plurality of fins and first plurality of gates being for N-type FinFET devices (NFETs); forming a second plurality of fins on the semiconductor substrate; forming a second plurality of gates with each gate of the second plurality of gates wrapping around at least one of the fins of the second plurality of fins, the second plurality of fins and second plurality of gates being for P-type FinFET devices (PFETs); depositing a first layer of a hard mask material selected from the group consisting of titanium nitride, tungsten nitride, tantalum nitride, amorphous carbon and titanium carbide over the NFETs and PFETs; depositing a second layer of a hard mask material selected from the group consisting of silicon oxide and silicon nitride over the first layer of hard mask material; removing the first and second layers of hard mask material from one of the NFETs and PFETs and avoiding removing the first and second layers of hard mask material from the other of the NFETs and PFETs; epitaxially depositing a first source and drain material on the fins of the one of the NFETs and PFETs; removing the second layer of hard mask material from the other of the NFETs and the PFETs; depositing a third layer of a hard mask material selected from the group consisting of titanium nitride, tungsten nitride, tantalum nitride, amorphous carbon and titanium carbide over the NFETs and PFETs; depositing a fourth layer of a hard mask material selected from the group consisting of silicon oxide and silicon nitride over the third layer of hard mask material; removing the third and fourth layers of the hard mask material from the other of the NFETs and PFETs; epitaxially depositing a second source and drain material on the fins of the other of the NFETs and PFETs; and removing the third and fourth layers of the hard mask material from the one of the NFETs and PFETs.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 1H illustrate a process for forming fins on a semiconductor substrate wherein:

FIG. 1A illustrates a starting structure including a semiconductor on insulator (SOI) substrate, an oxide layer, an amorphous silicon layer and a hard mask layer;

FIG. 1B illustrates the patterning of the amorphous silicon layer and the hard mask layer;

FIG. 1C illustrates the removal of the hard mask layer, leaving only stripes of amorphous silicon;

FIG. 1D illustrates the deposition of a conformal layer of nitride;

FIG. 1E illustrates the etching of the nitride to form sidewall spacers;

FIG. 1F illustrates the etching of the stripes of amorphous silicon to leave only the sidewall spacers;

FIG. 1G illustrates the etching of the oxide layer and the silicon layer of the SOI substrate using the sidewall spacers as a mask to result in stripes of oxide on silicon fins; and FIG. 1H illustrates the etching of the sidewall spacers and the oxide stripes to result in silicon fins.

FIG. 2 is a plan view of a FinFET structure comprising a plurality of N-type FinFETs (NFETS) and a plurality of P-type FinFETs (PFETS).

FIG. 3 is a side view of the FinFET structure of FIG. 2 illustrating a fin and a gate.

FIGS. 4 to 13 illustrate a first exemplary process for dual epitaxial integration of a FinFET structure wherein FIGS. 4 to 13 are cross-sectional views in the direction of arrows A-A in FIG. 2 and wherein:

FIG. 4 illustrates a semiconductor substrate having a plurality of fins;

FIG. 5 illustrates a first layer of hard mask material deposited on the fins;

FIG. 6 illustrates blocking a first half of the fins;

FIG. 7 illustrates the removal of the first layer of hard mask material from a second half of the fins;

FIG. 8 illustrates the removal of blocking material from the first half of the fins and epitaxial deposition of a first material on the second half of the fins to form first sources and drains;

FIG. 9 illustrates the deposition of a second layer of hard mask material over the fins;

FIG. 10 illustrates blocking the second half of the fins;

FIG. 11 illustrates the removal of the first and second layers of hard mask material from the first half of the fins;

FIG. 12 illustrates the removal of blocking material from the second half of the fins and epitaxial deposition of a second material on the first half of the fins to form second sources and drains; and FIG. 13 illustrates the removal of the second layer of hard mask material from the second half of the fins.

FIGS. 14 to 28 illustrate a second exemplary process for dual epitaxial integration of a FinFET structure wherein FIGS. 14 to 28 are cross-sectional views in the direction of arrows A-A in FIG. 2 and wherein:

FIG. 14 illustrates a semiconductor substrate having a plurality of fins;

FIG. 15 illustrates a first layer of hard mask material deposited on the fins;

FIG. 16 illustrates depositing a second layer of hard mask material on the fins;

FIG. 17 illustrates blocking a first half of the fins;

FIG. 18 illustrates the removal of the second layer of hard mask material from a second half of the fins;

FIG. 19 illustrates the removal of the first layer of hard mask material from the second half of the fins;

FIG. 20 illustrates the removal of blocking material from the first half of the fins and epitaxial deposition of a first material on the second half of the fins to form first sources and drains;

FIG. 21 illustrates the removal of the second layer of hard mask material from the first half of the fins;

FIG. 22 illustrates the deposition of a third layer and a fourth layer of a hard mask material over the fins;

FIG. 23 illustrates blocking the second half of the fins;

FIG. 24 illustrates the removal of the fourth layer of hard mask material from the first half of the fins;

FIG. 25 illustrates the removal of the first and third layers of hard mask material from the first half of the fins;

FIG. 26 illustrates the removal of the blocking material from the second half of the fins and epitaxial deposition of a second material on the first half of the fins to form second sources and drains;

FIG. 27 illustrates the removal of the fourth layer of hard mask material from the second half of the fins; and FIG. 28 illustrates the removal of the third layer of hard mask material from the second half of the fins.

DETAILED DESCRIPTION

FinFET devices may use epitaxial films for conformal doping and for reducing the external resistance of the device. However, since the doping in the epitaxial film needs to be different for N-type FinFET (hereafter "NFET") and P-type FinFET (hereafter "PFET") devices, dual integration becomes difficult in a CMOS (Complementary Metal Oxide Semiconductor) process flow.

Referring now to FIGS. 1A to 1H, there is illustrated a preferred process for forming a semiconductor substrate having fins for practicing the exemplary embodiments. The preferred process may be referred to as the sidewall image transfer process.

Figure 1B:
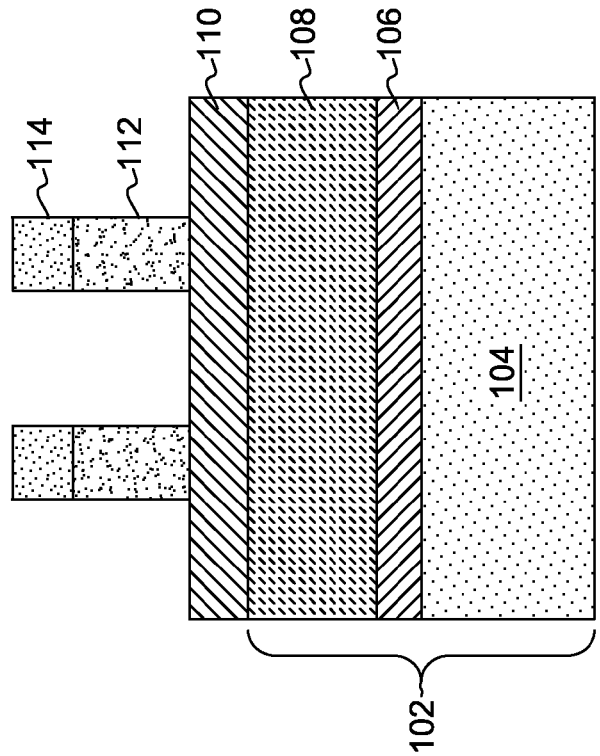
Figure 1A:
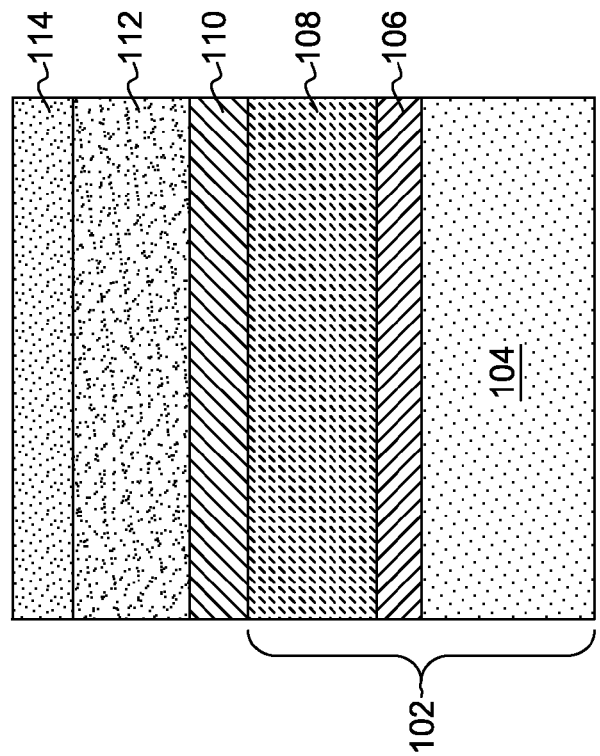

In FIG. 1A, the process begins with a semiconductor on insulator (SOI) substrate 102, also frequently referred to as a silicon on insulator substrate. The SOI substrate 102 may comprise a semiconductor base 104 (usually silicon but may be other semiconductor materials), a dielectric layer 106, usually an oxide layer (may also be called a buried oxide or BOX layer), and a semiconductor material 108, which is usually silicon. For the purposes of the present exemplary embodiments, it is preferred that semiconductor material 108 is silicon and will be referred to as such in the discussion that follows. On top of silicon 108 is an oxide layer 110, followed by an amorphous silicon layer 112 and hard mask layer 114, usually a nitride. Not shown in FIG. 1A are photoresist and other layers which may be used to pattern the hard mask layer 114.

Referring now to FIG. 1B, the hard mask layer 114 has been patterned and etched down through the amorphous silicon layer 112, stopping on the oxide layer 110.

Figure 1D:
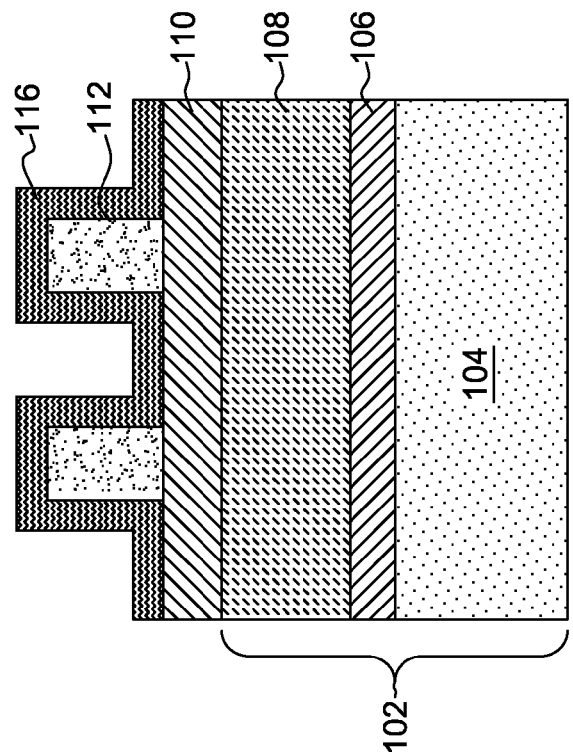
Figure 1C:
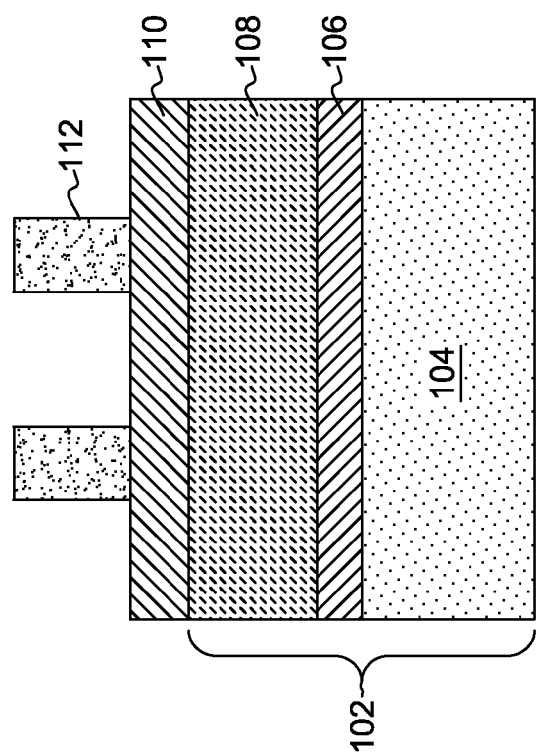

Referring now to FIG. 1C, the hard mask layer 114 has been conventionally stripped, leaving only stripes of amorphous silicon 112. Shown in FIG. 1C are only the ends of the stripes of amorphous silicon 112 which run perpendicular to the page.

Thereafter, a conformal layer of nitride 116 is deposited over the stripes of amorphous silicon 112, as shown in FIG. 1D.

Figure 1F:
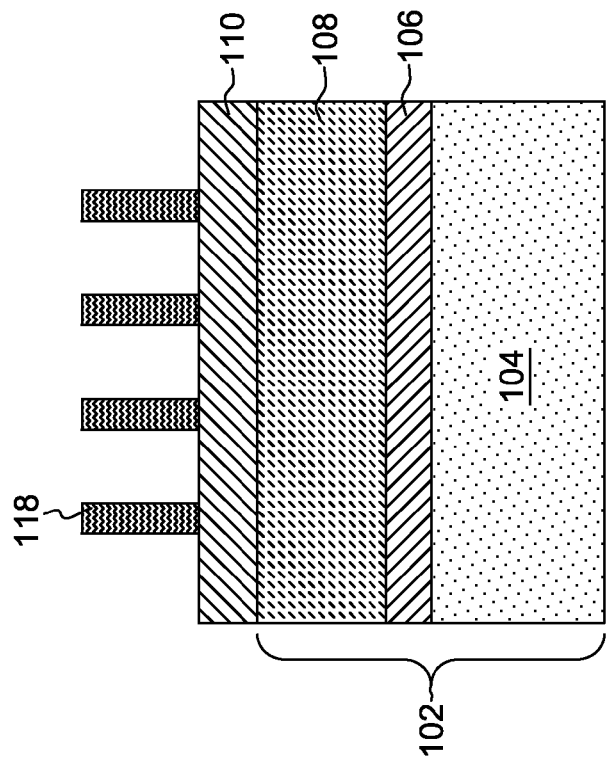
Figure 1E:
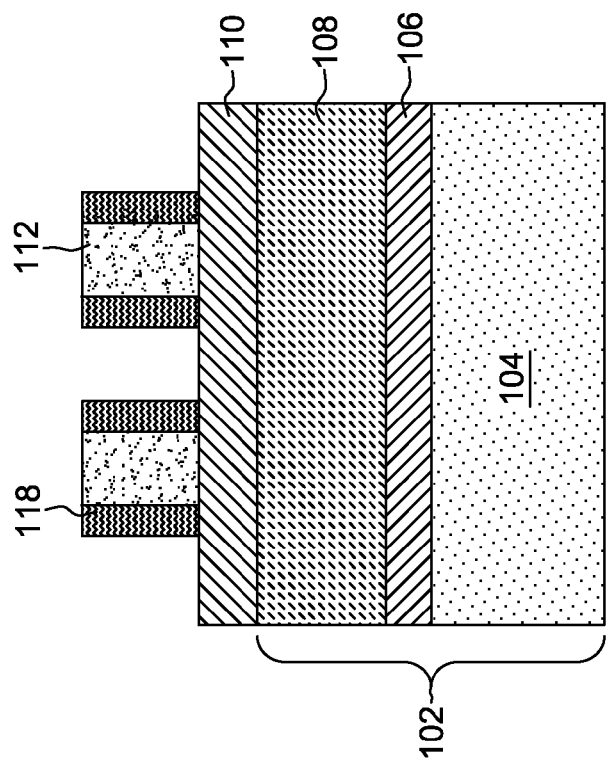

The conformal layer of nitride 116 is conventionally etched to form sidewall spacers 118, as shown in FIG. 1E, followed by conventionally etching the stripes of amorphous silicon 112 to result in only the spacers 118 left on the surface of oxide layer 110, as shown in FIG. 1F.

Using the spacers 118 as a mask, the substrate is etched to form fins 120 and stripes of oxide 122 on the fins 120 as shown in FIG. 1G.

Referring now to FIG. 1H, the spacers 118 and stripes of oxide 122 are conventionally etched to result in fins 120 on BOX layer 106.

Referring now to FIG. 2, there is illustrated a plan view of a starting FinFET structure 200 comprising a plurality of N-type FinFETs (NFETS) 202 and a plurality of P-type FinFETs (PFETS) 204. Each NFET 202 may comprise at least one fin 206 and a gate 208 wrapped around the fin 206. As shown in FIG. 2, the NFET 202 may comprise a plurality of fins 206 and corresponding gate 208 that wraps around each of the plurality of fins 206. Similarly, each PFET 204 may comprise at least one fin 210 and a gate 212 wrapped around the fin 210. As shown in FIG. 2, the PFET 204 may comprise a plurality of fins 210 and corresponding gate 212 that wraps around each of the plurality of fins 210. The NFET 202 and PFET 204 may be formed on a semiconductor substrate 214. The fins 206, 210 may be formed in a process such as that illustrated in FIGS. 1A to 1H.

FIG. 3 is a side view of the FinFET structure 200 of FIG. 2 illustrating the PFET 204 having a fin 210 and a gate 212 on semiconductor substrate 214. The semiconductor substrate 214, for purposes of illustration and not limitation, may comprise an SOI substrate and include a semiconductor base 216 and a BOX layer 218. The gate 212 may typically include a gate dielectric, for example, a high dielectric constant (high-k) material and a gate body, for example, polysilicon. These and other layers which may be present in the gate 212 are not shown for clarity. On top of gate 212 may be a hard mask layer such as silicon nitride.

FIGS. 4 to 13 illustrate a first exemplary process for dual epitaxial integration of a FinFET structure 400 wherein FIGS. 4 to 13 are cross-sectional views in the direction of arrows A-A in FIG. 2. The process for FinFET structure 400 may begin with the FinFET structure 200 of FIGS. 2 and 3. In the following process flow, epitaxially-deposited sources and drains may be formed on the ends of the fins 206, 210 (shown in FIG. 2) not covered by the gates 208, 212 (shown in FIG. 2).

Figure 4:
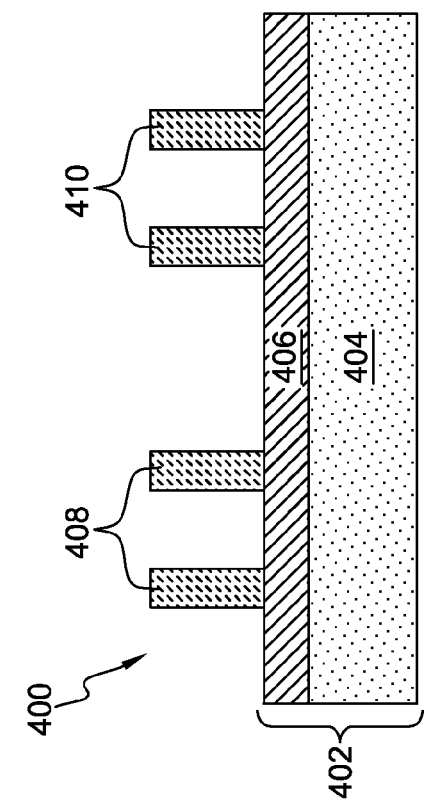

Referring first to FIG. 4, FinFET structure 400 includes a semiconductor substrate 402, which for purposes of illustration and not limitation may comprise an SOI substrate and include a semiconductor base 404 and a BOX layer 406. On top of semiconductor substrate 402 are a plurality of fins, some of the fins 408 being for NFET devices and some of the fins 410 being for PFET devices. The fins 408, 410 may be directly in contact with BOX layer 406.

Figure 5:
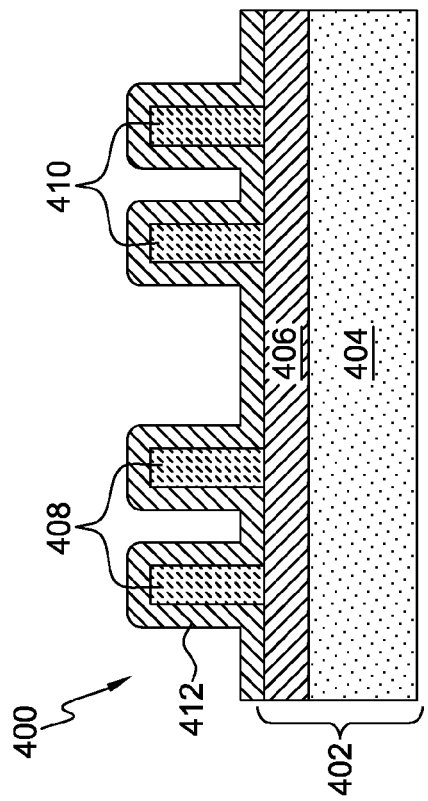

Thereafter, as shown in FIG. 5, a hard mask layer 412 is conformally deposited over the NFET fins 408, the PFET fins 410 and the semiconductor substrate 402. The hard mask layer 412 may be conformally deposited using physical vapor deposition (PVD), chemical vapor deposition (CVD) or Atomic layer deposition (ALD), preferably by ALD technique. The thickness can vary from 1 to 20 nm, preferably about 5 nm. The gate (not shown for convenience) is also covered by the hard mask layer 412. The hard mask layer 412 is not a typical hard mask layer but, rather, is a hard mask layer that may be selectively removed with respect to silicon oxide, silicon nitride, silicon and other materials that are typically found in the construction of a FinFET. The present inventors have found that the hard mask layer 412 may be titanium nitride, tungsten nitride, tantalum nitride, amorphous carbon or titanium carbide. The titanium nitride, titanium carbide, tungsten nitride and tantalum nitride may be selectively removed by ammonium peroxide while the amorphous carbon may be removed by an oxidizing etch. The ammonium peroxide is used at a concentration that is typically about 1:1 (ammonium peroxide to water, by weight) in concentration and operated at room temperature. The oxidizing etch is typically a plasma reactive ion etch (RIE) process using, for example, RF power of about 300 watts and an oxygen flow rate 200 sccm. The ammonium peroxide and oxide etchants may selectively etch the hard mask layer 412 without adversely affecting the silicon of the fins 408, 410 and the gates (not shown), the hard mask on the gate (such as silicon nitride hard mask 220 shown in FIG. 3), and the oxide of the BOX layer 406.

Titanium nitride is particularly preferred for the hard mask layer 412 because it may already be used in gate stack formation and may be removed by ammonium peroxide without any undercut issues. In addition, the ammonium peroxide etchant is very selective to silicon oxide, silicon nitride and silicon.

In the remainder of FIGS. 6 to 13, the epitaxial formation of the sources and drains is performed on the PFET fins 410 first followed by the NFET fins 408. This process flow is arbitrary and may be reversed so that the epitaxial formation of sources and drains may be done on the NFET fins 408 first followed by the PFET fins 410.

Figure 7:
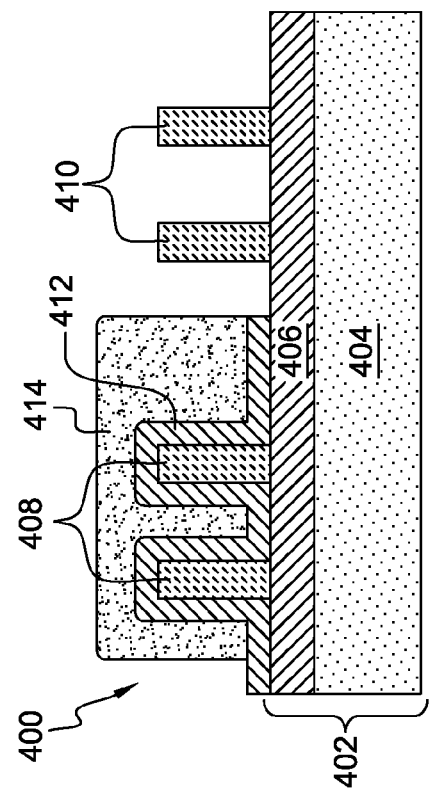
Figure 6:
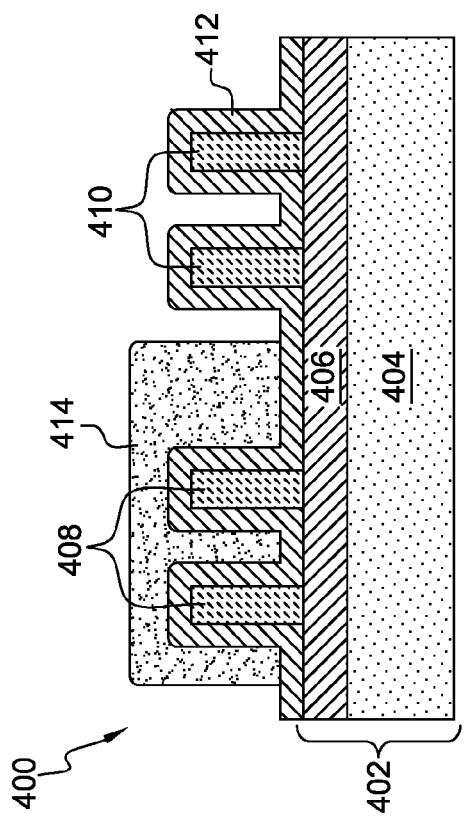

Referring now to FIG. 6, the NFET fins 408 and covering hard mask layer 412 are blocked with a material 414, for example, a photoresist. The gate (not shown) is also blocked with blocking material 414 at this time. Thereafter, the hard mask layer 412 is etched with ammonium peroxide or the oxide etchant as discussed above to remove the hard mask layer 412 from the PFET fins 410. The silicon of the PFET fins 410 and the oxide 406 of the semiconductor substrate are not adversely affected by the etching of the hard mask layer 412. The resulting structure is shown in FIG. 7.

Figure 8:
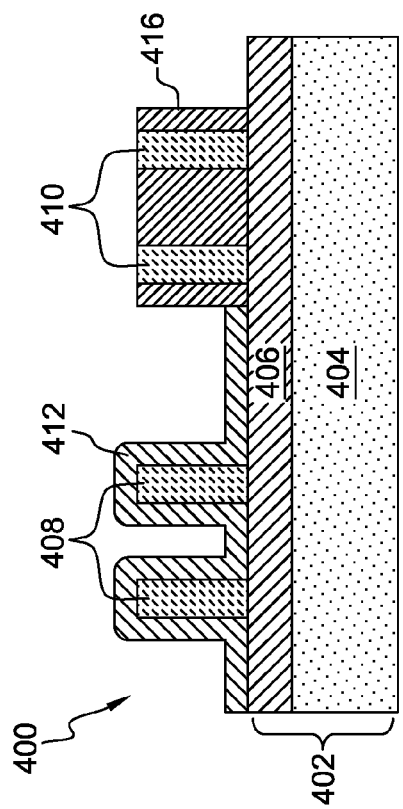

The blocking material 414 is conventionally stripped and then the FinFET structure 400 may undergo an optional ashing process to remove any residual photoresist (if the photoresist is used as the blocking material 414). Thereafter, the FinFET structure 400 is exposed to an epitaxial process to form an epitaxial layer 416 over the PFET fins 410 for the source and drains for the PFET device as shown in FIG. 8. It is preferred that the epitaxial layer 416 for the PFET fins 410 be silicon germanium. Silicon germanium is formed by epitaxial reaction of $SiH_4$ (silane) and $GeH_4$ (germane) at a temperature range of 400 to 900° C., preferentially about 640° C. The epitaxial layer 416 does not substantially adhere to the hard mask layer 412 so no blocking of the hard mask layer 412 is required.

Figure 9:
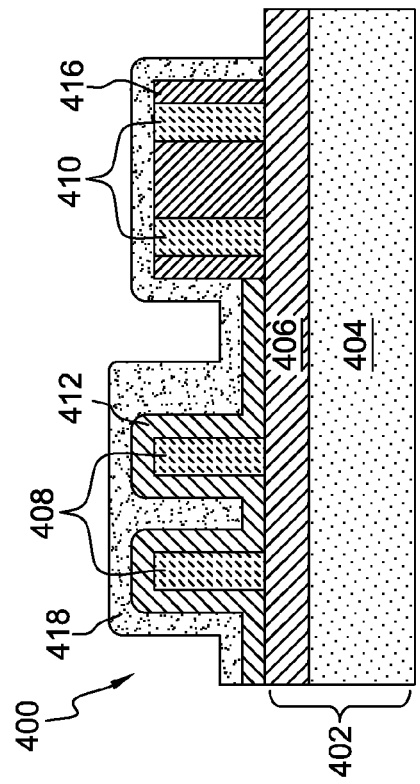

Referring now to FIG. 9, a second layer of hard mask material 418 is deposited on the FinFET structure 400 so as to cover the hard mask layer 412, the epitaxial layer 416 and the PFET fins 410. The thickness of this layer can range from 1 to 20 nm, preferably about 5 nm.

Thereafter, the PFET fins 410 and epitaxial layer 416 may be blocked by blocking material 420, such as a photoresist as shown in FIG. 10. The gate (not shown) is also blocked by blocking material 420 at this time. Then, the second hard mask layer 418 and the hard mask layer 412 may be etched with ammonium peroxide or the oxide etchant as discussed above to remove the hard mask layer 412 from the NFET fins 408. The silicon of the NFET fins 408 and the oxide 406 of the semiconductor substrate are not adversely affected by the etching of the second hard mask layer 418 and the hard mask layer 412. The resulting structure is shown in FIG. 11.

Referring now to FIG. 12, the blocking material 420 is conventionally stripped and then the FinFET structure 400 may undergo an optional ashing process to remove any residual photoresist (if the photoresist is used as the blocking material 420). Thereafter, the FinFET structure 400 is exposed to an epitaxial process to form an epitaxial layer 422 over the NFET fins 408 for the source and drains for the NFET device. It is preferred that the epitaxial layer 422 for the NFET fins 408 be phosphorous silicon. Phosphorus silicon is formed by epitaxial reaction of $SiH_4$ (silane) and $PH_3$ (phosphine) at a temperature range of 400 to 900° C., preferentially about 800° C. The epitaxial layer 422 does not substantially adhere to the second hard mask layer 418 so no blocking of the second hard mask layer 418 is required.

Finally, the second hard mask layer 418 and any remaining hard mask layer 412 are etched with ammonium peroxide or an oxide etchant to remove the second hard mask layer 418 and any remaining hard mask layer 412 from the PFET fins 410 and gate (not shown), resulting in the structure shown in FIG. 13. The silicon of the PFET fins 410 and the gate (not shown), the oxide 406 of the semiconductor substrate and the silicon nitride hard mask on the gate (not shown) are not adversely affected by the etching of the hard mask layer 412.

Further conventional semiconductor processing may proceed to finish the FinFET structure 400.

FIGS. 14 to 28 illustrate a second exemplary process for dual epitaxial integration of a FinFET structure 600 wherein FIGS. 14 to 28 are cross-sectional views in the direction of arrows A-A in FIG. 2. The process for FinFET structure 600 may begin with the FinFET structure 200 of FIGS. 2 and 3. In the following process flow, epitaxially-deposited sources and drains may be formed on the ends of the fins 206, 210 (shown in FIG. 2) not covered by the gates 208, 212 (shown in FIG. 2).

The second exemplary process is similar to the first exemplary process except that the second exemplary process may now include additional hard mask layers which may be silicon oxide or silicon nitride.

Figure 14:
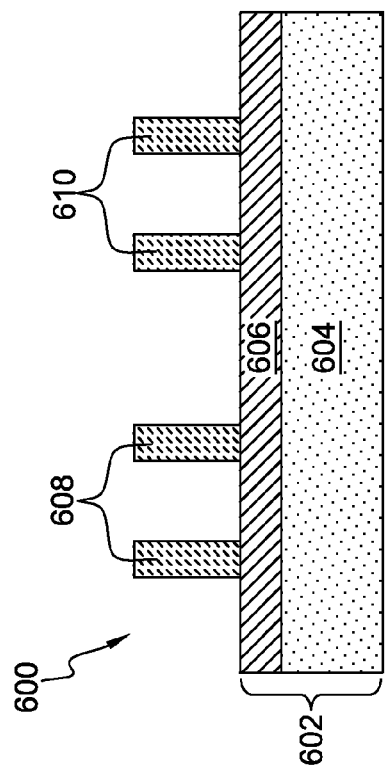

Referring first to FIG. 14, FinFET structure 600 includes a semiconductor substrate 602, which for purposes of illustration and not limitation may comprise an SOI substrate and include a semiconductor base 604 and a BOX layer 606. On top of semiconductor substrate 602 are a plurality of fins, some of the fins 608 being for NFET devices and some of the fins 610 being for PFET devices. The fins 608, 610 may be directly in contact with BOX layer 606.

Figure 15:
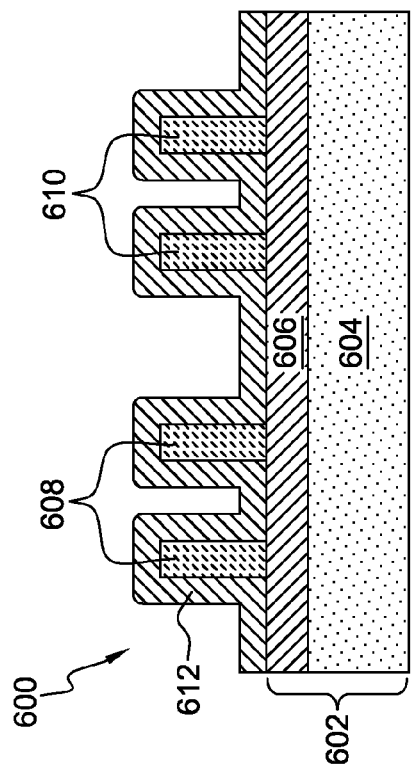

Thereafter, as shown in FIG. 15, a hard mask layer 612 is conformally deposited over the NFET fins 608, the PFET fins 610, the gate (not shown) and the semiconductor substrate 602. Hard mask layer 612 may be the same as hard mask layer 412 in the first exemplary embodiment and may be deposited in a similar manner and a similar thickness. As with hard mask layer 412, hard mask 612 may be etched with ammonium peroxide or an oxide etch, depending on the material as explained previously.

Again, titanium nitride is particularly preferred for the hard mask layer 612 because it may already be used in gate stack formation and may be removed by ammonium peroxide without any undercut issues. In addition, the ammonium peroxide etchant is very selective to oxide, silicon nitride and silicon.

Figure 16:
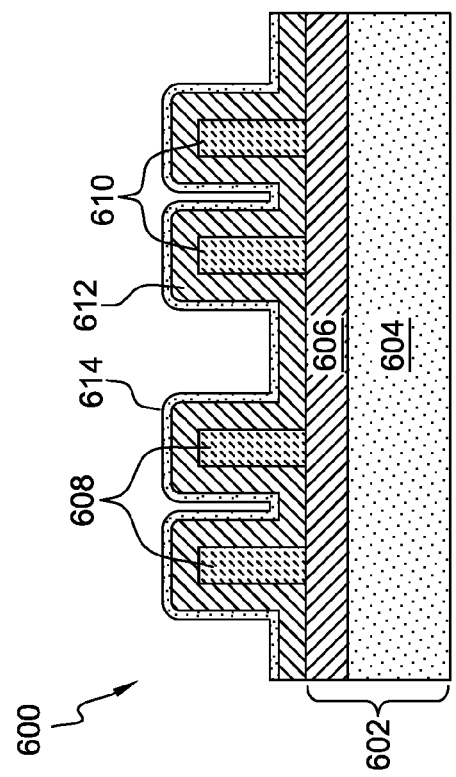

Referring now to FIG. 16, a second hard mask layer 614 may be deposited over the hard mask layer 612. The second hard mask layer 614 may be silicon oxide or silicon nitride. The second hard mask layer 614 may be conformally deposited, as shown in FIG. 16, or not conformally deposited. The thickness of the silicon oxide or silicon nitride is about 1 to 20 nm, preferentially about 5 nm. The layers are deposited using chemical vapor deposition (CVD) or atomic layer deposition (ALD), preferentially using atomic layer deposition techniques In the remainder of FIGS. 17 to 28, the epitaxial formation of sources and drains is performed on the PFET fins 610 first followed by the NFET fins 608. This process flow is arbitrary and may be reversed so that the epitaxial formation of sources and drains may be done on the NFET fins 608 first followed by the PFET fins 610.

Figure 17:
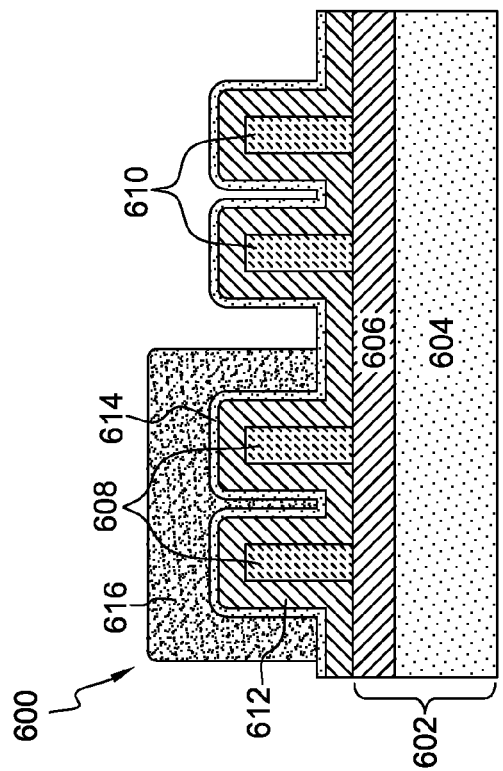
Figure 19:
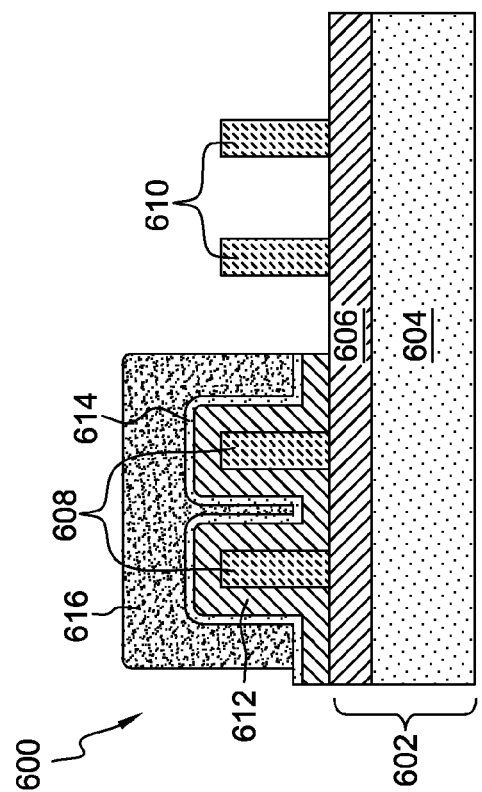
Figure 18:
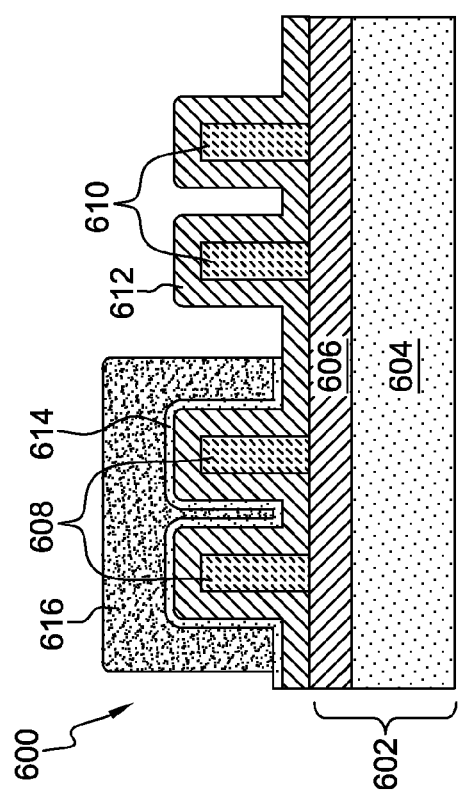
Figure 23:
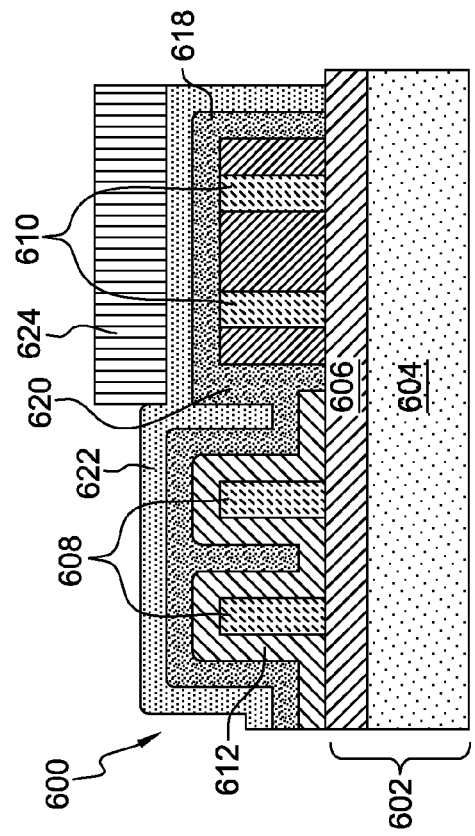

Referring now to FIG. 17, the NFET fins 608, covering hard mask layer 612 and covering second hard mask layer 614 are blocked with a material 616, for example, a photoresist. The gate (not shown) is also blocked by the blocking material 616. The second hard mask layer 614 may be etched from the PFET fins 610 by a suitable etchant such as hydrofluoric acid (HF) if the second hard mask layer 614 is silicon oxide and reactive ion etching (RIE) if the second hard mask layer 614 is silicon nitride resulting in the structure shown in FIG. 18. Thereafter, the hard mask layer 612 may be etched with ammonium peroxide or the oxide etchant as discussed above to remove the hard mask layer 612 from the PFET fins 610. The silicon of the PFET fins 610 and the oxide 606 of the semiconductor substrate are not adversely affected by the etching of the hard mask layer 612. The resulting structure is shown in FIG. 19.

The blocking material 616 may be conventionally stripped and then the FinFET structure 600 may undergo an optional ashing process to remove any residual photoresist (if the photoresist is used as the blocking material 616). Thereafter, the FinFET structure 600 is exposed to an epitaxial process to form an epitaxial layer 618 over the PFET fins 610 for the source and drains for the PFET device. It is preferred that the epitaxial layer 618 for the PFET fins 610 be silicon germanium as described with respect to the first exemplary embodiment. The epitaxial layer 618 does not substantially adhere to the second hard mask layer 614 so no blocking of the second hard mask layer 614 is required.

In this second exemplary embodiment, the second hard mask layer 614 is preferred for preventing the deposition of epitaxial material over the NFET fins 608 and may be preferred over using the hard mask layer 612 alone.

The remaining second hard mask layer 614 on the NFET fins 608 and the gate (not shown) may be etched from the hard mask layer 612 overlying the NFET fins 608 and the gate (not shown) by a suitable etchant such as hydrofluoric acid (HF) or RIE, depending on the material of the second hard mask layer 614 resulting in the structure shown in FIG. 21.

Figure 22:
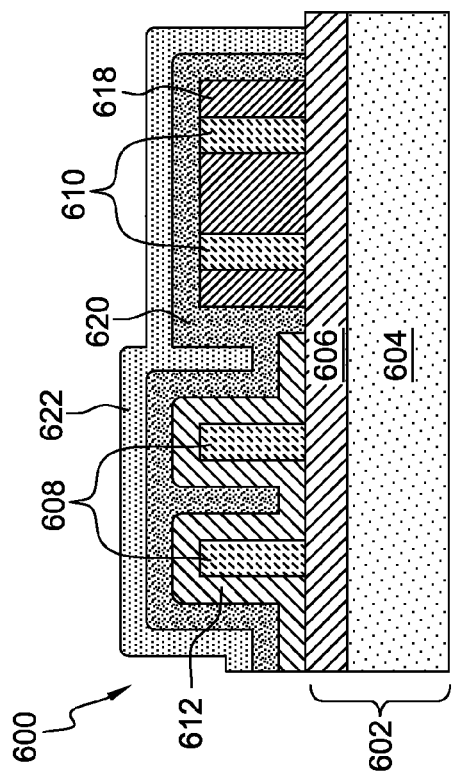

Referring now to FIG. 22 a third hard mask layer 620 is deposited on the FinFET structure 600 so as to cover the hard mask layer 612, the epitaxial layer 618 and the PFET fins 610. The third layer of hard mask material 620 may be the same as the hard mask layer 612 and may include titanium nitride, tungsten nitride, tantalum nitride, amorphous carbon or titanium carbide, with titanium nitride being preferred. In addition, a fourth hard mask layer 622 may be deposited over the third hard mask layer 620. The fourth hard mask layer 622 may be the same as the second hard mask layer 614 and may include silicon oxide or silicon nitride.

Thereafter, the PFET fins 610 and epitaxial layer 618 may be blocked by blocking material 624, such as a photoresist. The gate (not shown) is also blocked by blocking material 624. Then, the fourth hard mask layer 622 may be etched by HF or RIE, depending on the material, to result in the structure shown in FIG. 24. Thereafter, the third hard mask layer 620 and the hard mask layer 612 may be etched with ammonium peroxide or the oxide etchant as discussed above to remove the third hard mask layer 620 and the hard mask layer 612 from the NFET fins 608. The silicon of the NFET fins 608 and the oxide 606 of the semiconductor substrate 602 are not adversely affected by the etching of the third hard mask layer 620 and the hard mask layer 612. The resulting structure is shown in FIG. 25.

Referring now to FIG. 26, the blocking material 624 is conventionally stripped and then the FinFET structure 600 may undergo an optional ashing process to remove any residual photoresist (if the photoresist is used as the blocking material 624). Thereafter, the FinFET structure 600 is exposed to an epitaxial process to form an epitaxial layer 626 over the NFET fins 608 for the source and drains for the NFET device. It is preferred that the epitaxial layer 626 for the NFET fins 608 be phosphorous silicon as described above. The epitaxial layer 626 does not substantially adhere to the fourth hard mask layer 622 so no blocking of the fourth hard mask layer 622 is required.

Referring now to FIG. 27, the fourth hard mask layer 622 may be stripped in HF or RIE, depending on the material.

Figure 28:
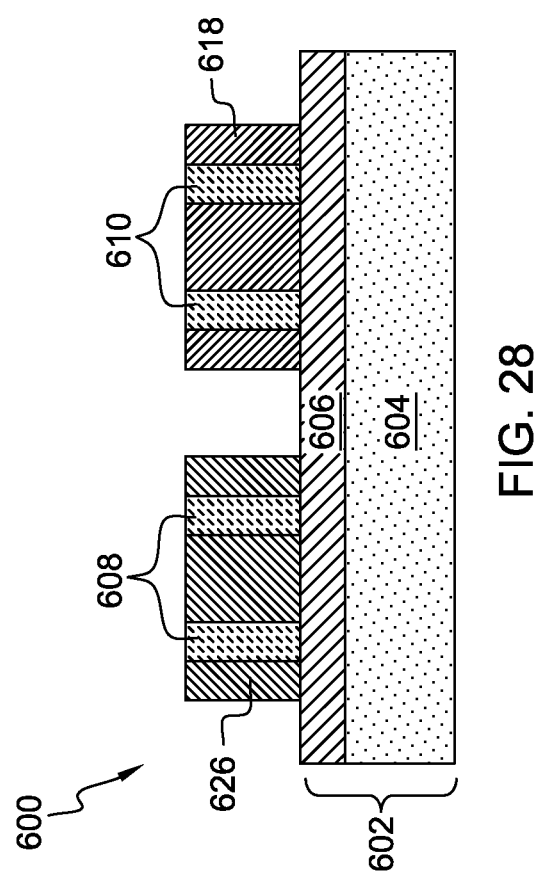

Finally, the third hard mask layer 620 and any remaining hard mask layer 612 are etched with ammonium peroxide or an oxide etchant to remove the third hard mask layer 620 and any remaining hard mask layer 612, resulting in the structure shown in FIG. 28.

Further conventional semiconductor processing may proceed to finish the FinFET structure 600.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A dual epitaxial integration process for FinFET devices comprising:
   forming a first plurality of fins on a semiconductor substrate;
   forming a first plurality of gates with each gate of the first plurality of gates wrapping around at least one of the fins of the first plurality of fins, the first plurality of fins and first plurality of gates being for N-type FinFET devices (NFETs);
   forming a second plurality of fins on the semiconductor substrate;
   forming a second plurality of gates with each gate of the second plurality of gates wrapping around at least one of the fins of the second plurality of fins, the second plurality of fins and second plurality of gates being for P-type FinFET devices (PFETs);
   depositing a first layer of a hard mask material selected from the group consisting of titanium nitride, tungsten nitride, tantalum nitride, amorphous carbon and titanium carbide over the NFETs and PFETs;
   removing the hard mask material from one of the NFETs and PFETs and avoiding removing the hard mask material from the other of the NFETs and PFETs;
   epitaxially depositing a first source and drain material on the fins of the one of the NFETs and PFETs;
   depositing a second layer of the hard mask material over the NFETs and PFETs;
   removing the first and second layers of the hard mask material from the other of the NFETs and PFETs;
   epitaxially depositing a second source and drain material on the fins of the other of the NFETs and PFETs; and
   removing the second layer of the hard mask material from the one of the NFETs and PFETs.

2. The dual epitaxial integration process of claim 1 wherein the steps of removing the hard mask material from one of the NFETs and PFETs, removing the first and second layer of the hard mask material and removing the second layer of the hard mask material are by exposing the hard mask material to ammonium peroxide.

3. The dual epitaxial integration process of claim 1 wherein the one of the NFETs and PFETs are the PFETs and the first source and drain material is silicon germanium.

4. The dual epitaxial integration process of claim 3 wherein the other of the NFETs and the PFETs are the NFETs and the second source and drain material is phosphorus silicon.

5. The dual epitaxial integration process of claim 1 wherein the one of the NFETs and PFETs are the NFETs and the first source and drain material is phosphorus silicon.

6. The dual epitaxial integration process of claim 5 wherein the other of the NFETs and the PFETs are the PFETs and the second source and drain material is silicon germanium.

7. The dual epitaxial process of claim 1 wherein the hard mask material is titanium nitride.

8. A dual epitaxial integration process for FinFET devices comprising:
   forming a first plurality of fins on a semiconductor substrate;
   forming a first plurality of gates with each gate of the first plurality of gates wrapping around at least one of the fins of the first plurality of fins, the first plurality of fins and first plurality of gates being for N-type FinFET devices (NFETs);
   forming a second plurality of fins on the semiconductor substrate;
   forming a second plurality of gates with each gate of the second plurality of gates wrapping around at least one of the fins of the second plurality of fins, the second plurality of fins and second plurality of gates being for P-type FinFET devices (PFETs);
   depositing a first layer of a hard mask material selected from the group consisting of titanium nitride, tungsten nitride, tantalum nitride, amorphous carbon and titanium carbide over the NFETs and PFETs;
   depositing a second layer of a hard mask material selected from the group consisting of silicon oxide and silicon nitride over the first layer of hard mask material;
   removing the first and second layers of hard mask material from one of the NFETs and PFETs and avoiding removing the first and second layers of hard mask material from the other of the NFETs and PFETs;
   epitaxially depositing a first source and drain material on the fins of the one of the NFETs and PFETs;
   removing the second layer of hard mask material from the other of the NFETs and the PFETs;
   depositing a third layer of a hard mask material selected from the group consisting of titanium nitride, tungsten nitride, tantalum nitride, amorphous carbon and titanium carbide over the NFETs and PFETs;
   depositing a fourth layer of a hard mask material selected from the group consisting of silicon oxide and silicon nitride over the third layer of hard mask material;
   removing the third and fourth layers of the hard mask material from the other of the NFETs and PFETs;
   epitaxially depositing a second source and drain material on the fins of the other of the NFETs and PFETs; and
   removing the third and fourth layers of the hard mask material from the one of the NFETs and PFETs.

9. The dual epitaxial integration process of claim 8 wherein removing the first and third layers of hard mask material from the NFETs and PFETs is by exposing the hard mask material to ammonium peroxide.

10. The dual epitaxial integration process of claim 8 wherein the one of the NFETs and PFETs are the PFETs and the first source and drain material is silicon germanium.

11. The dual epitaxial integration process of claim 10 wherein the other of the NFETs and the PFETs are the NFETs and the second source and drain material is phosphorus silicon.

12. The dual epitaxial integration process of claim 8 wherein the one of the NFETs and PFETs are the NFETs and the first source and drain material is phosphorus silicon.

13. The dual epitaxial integration process of claim 12 wherein the other of the NFETs and the PFETs are the PFETs and the second source and drain material is silicon germanium.

14. The dual epitaxial process of claim 8 wherein the first and third layers of hard mask material is titanium nitride.

* * * * *